United States Patent [19]

Barel et al.

[11] Patent Number: 5,774,006
[45] Date of Patent: Jun. 30, 1998

[54] CLOCK GENERATOR AND METHOD FOR GENERATING A CLOCK SIGNAL

[75] Inventors: Udi Barel, Rishon Le Zion; Micha Stern, Neve Ilan, Yavne; Ido Reuveny, Rishon Le Zion; Yoram Yeivin, Hod-Hasharon, all of Israel

[73] Assignee: Motorola, Inc., Schaumburg, Ill.

[21] Appl. No.: 803,788

[22] Filed: Feb. 24, 1997

[51] Int. Cl.[6] .................................................. H03K 13/02
[52] U.S. Cl. .............................. 327/291; 327/299; 331/74
[58] Field of Search ..................................... 327/291, 293, 327/294, 299; 331/74

[56] References Cited

U.S. PATENT DOCUMENTS 5,469,116  11/1995  Slemmer ................................. 327/291
5,491,441  2/1996  Goetschel et al. ...................... 327/291
5,568,078  10/1996  Lee ......................................... 327/291

FOREIGN PATENT DOCUMENTS 7325640  12/1995  Japan ................................. G06F 1/04

*Primary Examiner*—Son T. Dinh
*Attorney, Agent, or Firm*—Robert M. Handy; Rennie William Dover

[57] ABSTRACT

In a clock generator (100), an oscillator (30) supplies an oscillator signal (38) to a first trigger (10) and to a second trigger (20). The triggers change the oscillator signal (38) to a first and a second trigger signal (18, 28). The second trigger (20) has a larger hysteresis range than the first trigger (10), so that the first trigger signal (18) starts toggling before the second trigger signal (28) starts toggling. A detector (40) determines that the second trigger signal (28) toggles at least three times, that means that the oscillator signal (38) goes over the larger hysteresis range in two directions. The detector (40) provides a result to a control circuit (50) which derives a clock signal (98) from the first trigger signal (18).

18 Claims, 4 Drawing Sheets

CLOCK GENERATOR

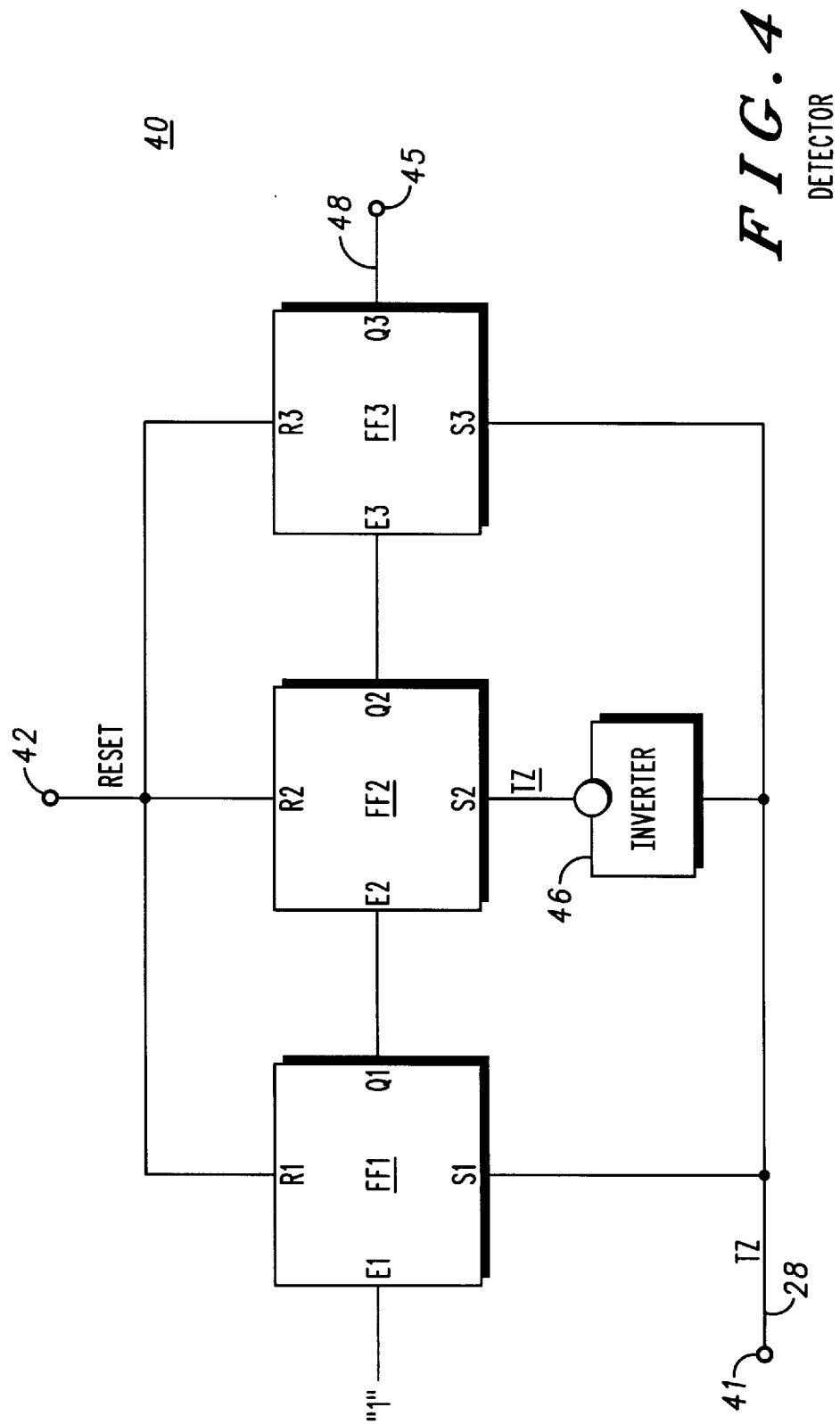
FIG. 4 DETECTOR

CLOCK GENERATOR AND METHOD FOR GENERATING A CLOCK SIGNAL

FIELD OF THE INVENTION

This invention relates to electronic circuits, especially to clock generators and a method for generating a clock signal.

BACKGROUND OF THE INVENTION

Clock generators are used in a variety of applications to generate a clock signal CLK. Such applications often require that the clock signal is available and stable within a short time interval after the application is switched on. Oscillators of clock generators often comprise quartz crystals or other elements as a frequency base.

FIG. 1 shows a simplified signal-time diagram of an oscillator signal x(t) generated by the oscillator. The oscillator signal x(t) is shown on the vertical axis, the time t and the number of periods n are shown on horizontally axis. The oscillator signal x(t) has a rated frequency f and a rated period time $T=1/f$. The oscillator is switched on at $t=0$.

A transition interval $T_R$ is defined between $t=0$ and a time $t_R$ in the future. During $T_R$, the oscillator signal x(t) is not stable. After $t=t_R$, the oscillator signal x(t) is stable and can be used for deriving the clock signal CLK. From $t=t_0$, the periods n of x(t) are counted. During the transition interval $T_R$, the oscillator signal x(t) alternates in a number of $N_R$ periods. During the transition interval $T_R$, the oscillator signal x(t) can have an increasing amplitude X(t) and a varying period time T. Also, spikes and other unwanted discontinuities are possible. The transition interval $T_R$ and therefore the number of periods $N_R$ can change depending on the environmental conditions (e.g., temperature, supply voltage) in which the oscillator is used. $N_R$ can also depend on, for example, manufacturing variations of the crystal and the chip by which the oscillator is implemented.

It is known in the art to design clock generators having means for counting the periods n of x(t) after $t=0$ or $t=t_0$. At $t=t_N$, x(t) has finished at least $n=N$ periods. The clock signal CLK can be derived from x(t). The number N is larger or equal $N_R$. Since $N_R$ is variable and often unknown, N is chosen big enough to cover all eventualities.

When oscillator signal x(t) becomes stable at $t=t_R$ after at least $N_R$ periods, it still has $N-N_R$ periods ahead (in a time $T*(N-N_R)$) until the clock signal CLK is derived at time $t_N$. The number N is usually chosen as a large number of several ten thousand or even more periods. The waiting time $T_W$ is the time between $t=0$ (switch on) and $T_N$ (deriving CLK). This waiting time $T_W>N*T$ is inconvenient for many applications. For example, a low frequency generator (e.g., f=32 kHz, N=64000) can have a waiting time $T_W$ of at least 2 seconds. A clock generator operating according to the above mentioned principle is introduced in the published application JP-7-325640. The circuit comprises two triggers and a up-and down counter.

The waiting time $T_W$ comprises an interval between $t=t_R$ and $t=t_N$ in which x(t) is stable enough but in which CLK is still not derived in the prior art. Hence, there is an ongoing need to design a clock generator that provides stable CLK with a small as possible waiting time and that reduces or overcomes these or other disadvantages of the prior art.

BRIEF DESCRIPTION OF THE DRAWINGS

FIG. 4 shows a detector of the clock generator of FIG. 2.

DETAILED DESCRIPTION OF A PREFERRED EMBODIMENT

In prior art, the criterion for deciding from what time $t_N$ oscillator signal x(t) can be used to derive the clock signal CLK can be defined as an AND-combination of two conditions:

1) Oscillator signal x(t) must have countable periods; AND
2) At $t=t_N$, oscillator signal x(t) must have a certain number N of counted periods.

The present invention overcomes the limitations of the prior art by use of multiple threshold detectors (triggers) combined with a detector for counting an output of one or more of the threshold detectors to send an enable signal to a control circuit for deriving a valid clock signal with minimum delay. The present invention will be more fully understand in connection with FIGS. 2–4 and the text which follows.

Figure 2:
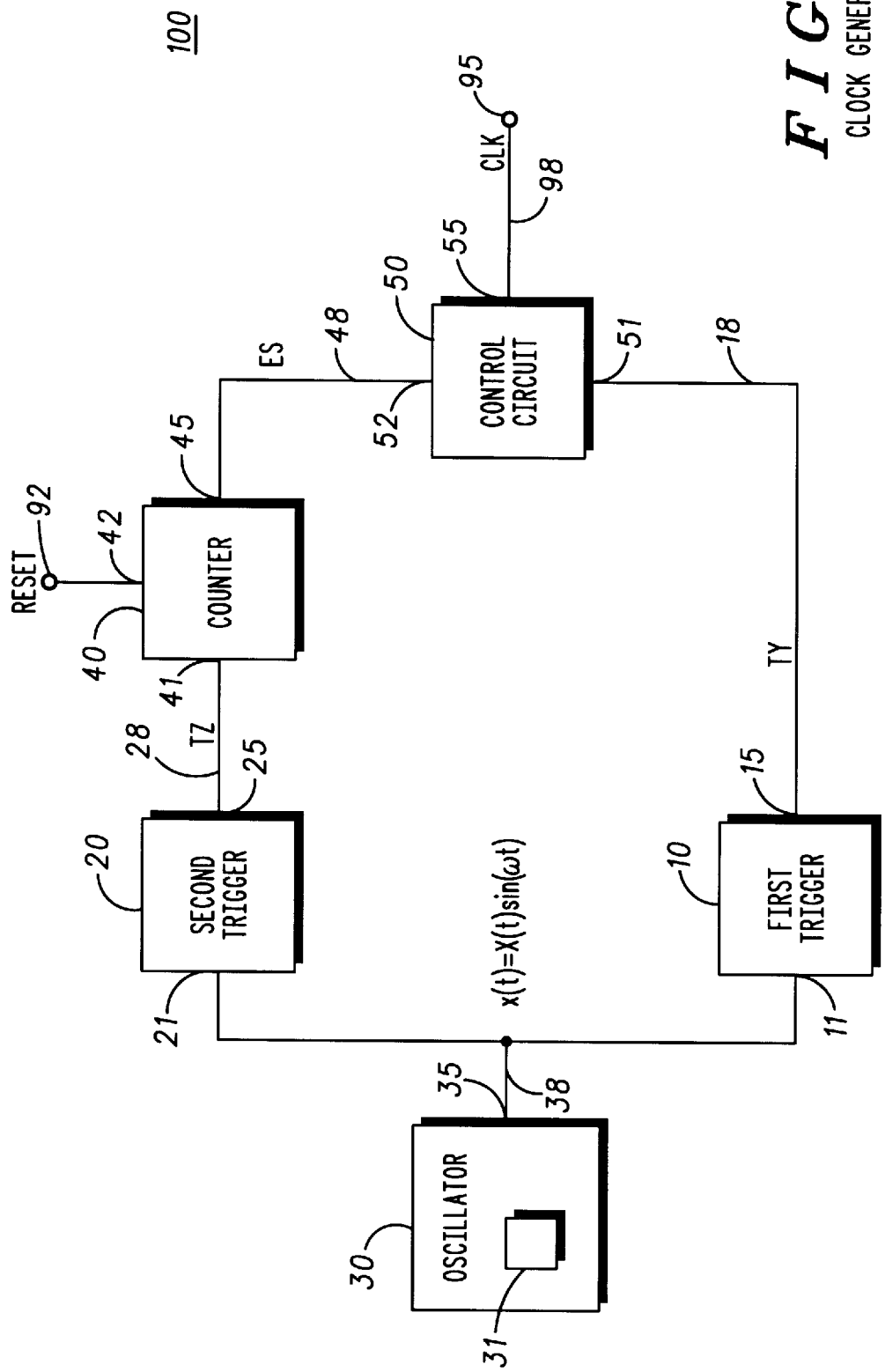
FIG. 2 shows a simplified block diagram of a clock generator of the present invention.

FIG. 2 shows a simplified block diagram of clock generator 100 according to the present invention. Clock generator 100 comprises oscillator 30, first trigger 10, second trigger 20, detector 40, and control circuit 50. Clock generator 100 has reset terminal 92 and output terminal 95. Output 35 of oscillator 30 is coupled to input 11 of first trigger 10 and to input 21 of second trigger 20. Output 15 of first trigger 10 is coupled to input 51 of control circuit 50. Output 25 of second trigger 20 is coupled to input 41 of detector 40. Output 45 of detector 40 is coupled to input 52 of control circuit 50. Output 55 of control circuit 50 is coupled to output terminal 95. Reset terminal 92 is coupled to input 42 of detector 40.

Preferably, oscillator 30 comprises quartz crystal 31 as frequency base. The term 'quartz crystal' is intended to include other elements which can be used as a frequency base. Additional circuitry required to produce oscillations by quartz crystal 31 is well known in the art and not essential for the invention.

Oscillator 30 generates periodic oscillator signal 38 (hereinafter x(t)) which is supplied to first trigger 10 and to second trigger 20. Preferably, first trigger 10 and second trigger 20 are Schmitt triggers with different hysteresis ranges. First trigger 10 supplies first trigger signal 18, hereinafter TY, to control circuit 50. Second trigger 20 supplies second trigger signal 28, hereinafter TZ, to detector 40 at input 41. Reset terminal 92 supplies reset signal RESET to detector 40 at input 42. Detector 40 supplies enable signal 48, hereinafter ES, to control circuit 50. Control circuit 50 supplies clock signal 98, hereinafter CLK, to output terminal 95. Control circuit 50 is, preferably, an AND or NAND-gate generally known in the art. Control circuit 50 receives TY and ES as input signals and provides CLK as output signal. CLK has a predetermined and substantially constant duty cycle. As it will be explained in details later, TY and TZ are also periodic signals which start oscillating consecutively (TY first, TZ second). The number of alternations of TZ is counted in detector 40. When a predetermined number is reached, control circuit 50 derives CLK from TY.

Figure 3:
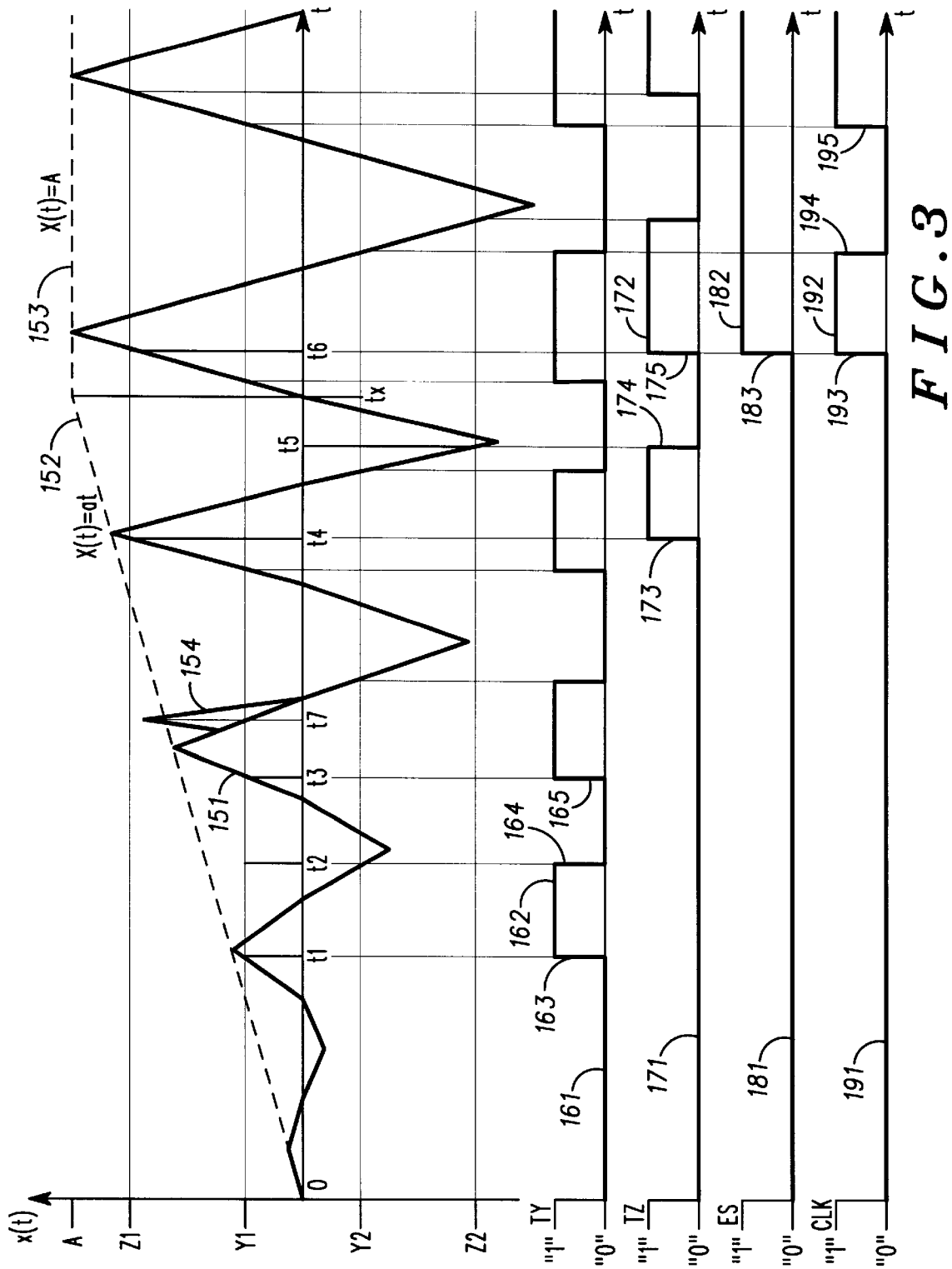
FIG. 3 shows signal-time diagrams of an oscillator signal, of a first and a second trigger signal, of an enable signal and of the clock signal as used in the clock generator of FIG. 2.

FIG. 3 shows signal-time diagrams of oscillator signal x(t), of first trigger signal TY, of second trigger signal TZ, of enable signal ES and of clock signal CLK as used in clock generator 100. Traces 151–154 refer to x(t), traces 161–165 to TY, traces 171–175 to TZ, traces 181–183 to ES, and traces 191–195 to CLK. Trace 154 shows a spike. The time t is shown horizontally. Time points 0, t1, t2, t3, t4, t5, t6, t7, and tx are given for explanation here or later. A first vertical axis "x(t)" shows first thresholds Y1, Z1 and second thresholds Y2, Z2 of first trigger 10 and second trigger 20. It also shows a final amplitude A of x(t). Further vertical axis ("TY", "TZ", "ES", "CLK") symbolize logical states "1" and "0" of TY, TZ, ES, and CLK. As in FIG. 3, a first direction from the bottom to the top of the page signifies an increasing signal level and a second, opposite direction signifies decreasing level. The term 'level' is a convenient abbreviation for the quantity by which signals, thresholds and amplitudes are expressed, such as, for example, by voltages, currents, or charges. Following this assumption, the terms 'high' or 'low' and their grammatical variations are applicable accordingly. As used in the following, the phrase 'Signal x(t) passes a threshold' signifies that the level of x(t) becomes higher than a threshold (e.g., Y1, Z1) or goes below a threshold (e.g., Y2, Z2).

Signals TY, TZ, ES, and CLK are, preferably, binary signal having logical "1" states (e.g., traces 162, 172, 182, 192) and logical "0" states (e.g., traces 161, 171, 181, 191). Merely for the convenience of explanation, it is assumed that logical "1" is expressed by higher levels and that logical "0" is expressed by lower levels. The term 'toggle' describes a transition from one logical state (e.g., "0") to the opposite logical state (e.g., "1") in either direction. An absolute direction ("first", "second") is thereby not essential. The term 'toggle back' is used to indicate a reversed transition in contrast to a 'toggle'-transition. In the example of FIG. 3, TY, TZ and CLK toggle to "1" (e.g., traces 163, 165, 173, 175, 193, 195) and toggle back to "0" (e.g., traces 164, 174, 194). DS toggles to "1" (trace 183).

Also, the times required by the binary signals to toggle, are neglected, so that binary signals are shown with perpendicular edges. A person of skill in the art will be able to implement clock generator 100 based on different assumptions without departing from this present invention.

Oscillator signal x(t) (trace 151) of oscillator 30 is an analog signal. Signal x(t) can be approximated, for example, by the function:

$$x(t)=X(t) \sin (2 *\pi*f*t), \quad (1)$$

with the symbol '*' representing multiplication.

X(t) is the amplitude of x(t). In a first interval between t=0 and t=tx, the amplitude X(t) is assumed to increase linearly as X(t)=a*t, with being 'a' constant rate, but this is not essential. X(t)=at is illustrated by dashed trace 152. In a following second interval beginning at t=tx, the amplitude X(t) remains substantially constant X(t)=A, The symbol 'A' stands for a final, substantially constant amplitude (dashed trace 153). The approximation of x(t) by a sine function is convenient for explanation, but not limiting. As a person of skill in the art will understand, x(t) can include additional terms, e.g., for a constant level, or x(t) can be approximated by other periodic functions. For simplicity, in FIG. 3 the sine function is drawn by straight lines.

In first trigger 10, first interval I1 is defined as the difference |Y1–Y2| ("hysteresis range") between first threshold Y1 and second threshold Y2. Trigger signal TY toggles when an increasing oscillator signal x(t) passes Y1 and TY toggles back when decreasing x(t) passes Y2. The toggling direction is not essential. As it is shown for convenience of explanation, TY toggles from "0" to "1" when x(t) passes Y1 (i.e., becomes higher than) and toggles back from "1" to "0" when x(t) passes Y2 (goes below).

Second trigger 20 has first threshold Z1 and second threshold Z2. Second interval I2 is defined as the difference |Z1–Z2| ("hysteresis range"). Having an non-essential toggling direction, TZ toggles to "1" for x(t) becoming higher than Z1 (passing Z1) and toggles back to "0" for x(t) becoming lower than Z2 (passing Z2). Interval I1 of first trigger 10 is smaller than interval I2 of second trigger 20. For example, intervals can be I1=0.6 volts and I2=1 volts. In such a configuration, I2 has substantially the doubled value of I1.

Preferably, first trigger 10 and second trigger 20 only toggle if the change rate α (amount of the first deviation |dx(t)/dt|) of x(t) is below a limit α1 for trigger 10 or α2 for trigger 20. If a spike (as e.g., in trace 154) is superimposed on x(t), than the change rate is too high (α>α1 or α>α2) and trigger signals TY, TZ do not toggle. Preferably, 51 Z1| and |Z2| are larger than the magnitude of the spikes.

Having described the elements of clock generator 100 and having defined signals, the method of the present invention is now explained by way of a non-limiting example. Clock generator 100 is switched on at t=0 or slightly earlier. It is assumed that at t=0, oscillator signal x(t) has a value of, e.g., x(t)=0 and that first trigger 10 and second trigger 20 provide TY and TZ, respectively, at logical "0" state (traces 161, 171). A person of skill in the art understands, that oscillator signal x(t) can be, e.g., x(t)=A>Z1>Y1, for times before t=0. In that case TY and TZ would initially have logical "1" states. But this has no influence on the function of generator 100 of the present invention. Enable signal ES and clock signal CLK are also at, e.g., logical "0" state (traces 181, 191). From t=0, Oscillator 30 starts providing oscillator signal x(t) with an increasing amplitude X(t). When x(t) moves between first threshold Y1 and second threshold Y2 of first trigger 10, then first trigger signal TY starts toggling between "0" and "1" (e.g., traces 163, 164, 165 and so forth). When the amplitude of x(t) further increases, then second trigger signal TZ of second trigger 20 toggles between "0" and "1" (e.g., traces 173, 174, 175). This transitions of TZ ("TZ transitions") are counted in detector 40. When TZ toggles than the duty cycle of TY is, preferably, constant. That means "0"-times and "1"-times remain substantially constant. When the number n' of TZ transitions ("togglings") reaches a predetermined number N' (e.g., N'=3, traces 173, 174, 175), then ES is set to logical "1" (trace 183) and, preferably, remains at "1". In control circuit 50, constant ES (at "1") is combined with toggling TY to CLK. CLK starts to toggle (e.g., traces 193, 194, 195). ES is thereby a signal which enables control circuit 50. CLK is derived from TY, for example, by the function:

$$\text{CLK=ES AND TY} \quad (2)$$

'AND' symbolizes a logical conjunctive relation.

Figure 1:
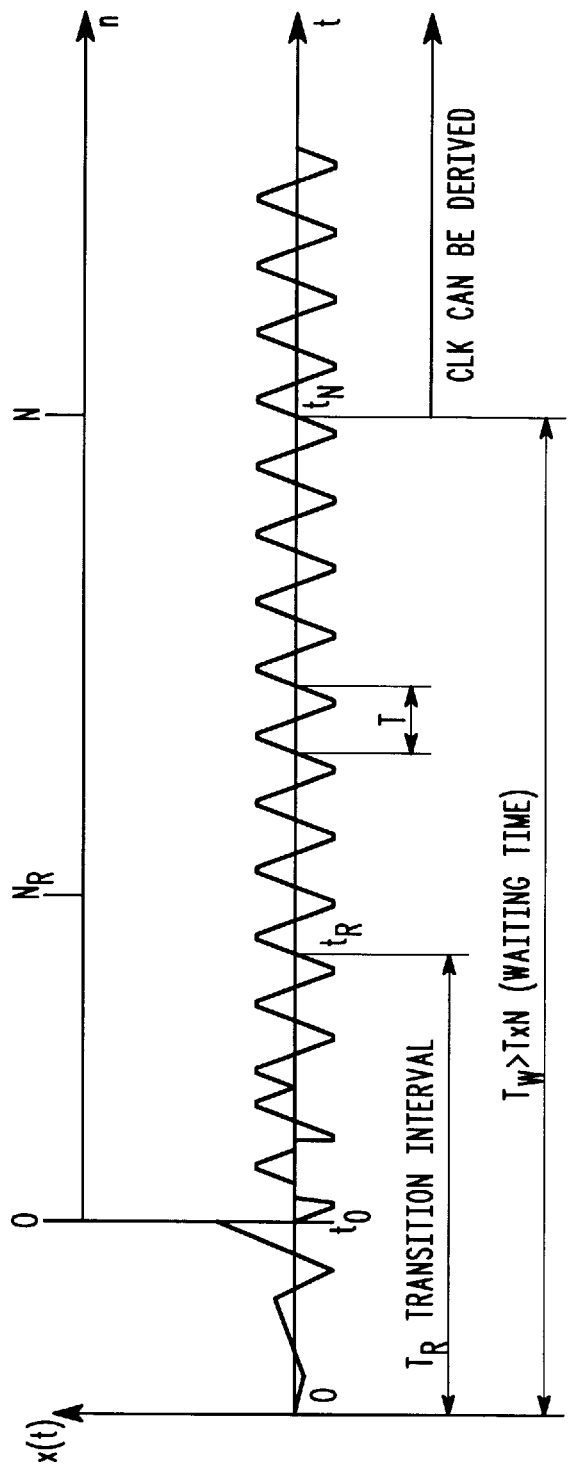
FIG. 1 shows a simplified signal-time diagram of an oscillator signal generated by an oscillator.

In prior art solutions, CLK is derived from the same signal (e.g., x(t) in FIG. 1) which is also counted. In the present invention, CLK is derived from a first trigger signal (e.g., TY) which is, preferably, not counted. Moreover, the transitions of a second trigger signal (e.g., TZ) are counted. As in the present invention, deriving (e.g., in trigger 10 and control circuit 50) and counting (e.g., in trigger 20 and control circuit) is independent. Compared to the prior art, the stability is increased and the waiting time (e.g., in FIG. 3 between t=0 and t6) can be decreased.

FIG. 4 shows detector 40 of clock generator 100. The following description is intended to show a preferred way of implementing detector 40 and does not limit the present invention. A person of skill in the art can construct different detectors having the same or similar functionality. Detector 40 has input 41 for receiving second trigger signal TZ and output 45 for providing ES. Input 42 receives the reset signal RESET. Detector 40 comprises flip-flops FF1, FF2, and FF3 and inverter 46. The flip-flops are collectively referred to as FFi, with 'i' as an index. Flip-flops FF1, FF2, and FF3 have reset inputs R1, R2, and R3, set inputs S1, S2, and S3, and enable inputs E1, E2, and E3, respectively. Outputs are Q1, Q2, and Q3. The inputs and outputs are collectively referred to as Ri, Si, Ei, Qi with 'i' being the index of flip-flop FFi. Output Q1 is coupled to enable input E2, output Q2 is coupled to enable input E3, and output Q3 serves as output 45. Reset inputs Ri are coupled to input 42. Inverter 46 and set inputs S1 and S3 are coupled to input 41. The output of inverter 46 is coupled to set input S2 of FF2.

Set inputs S1 and S3 receive trigger signal TZ and inverter 46 provides an inverted trigger signal $\overline{TZ}$ for set input S2 of FF2. The underscoring of the symbol indicates logical inversion, e.g., $\overline{TZ}$ is the logical inversion of TZ. Reset inputs Ri receive RESET. It is convenient but not limiting to have RESET="1" when clock generator 100 is being switched. RESET can also be activated ("1"), for example, after a power failure.

With enable input Ei="0", the output Qi of FFi does not change. For enable input Ei="1", flip-flops FFi behave like RS-type flip flops well known in the art. For simplicity, in FIG. 4, enable input E1 of FF1 is shown as permanently connected to logical "1". A person of skill in the art will be able to modify the implementation and design FF1 without enable input E1.

The function of flip-flops FF1, FF2, and FF3 are illustrated by the following truth table. The terms 'k' and 'k+1' are intended to indicate states before and after input signals Ei, Si, or Ri change.

| inputs of FFi | | | outputs of FFi |
|---|---|---|---|
| enable Ei | set Si | reset Ri | Qi(k + 1) |
| 1 | 1 | 0 | 1 |
| 1 | 0 | 1 | 0 |
| 1 | 1 | 1 | 0 |
| 1 | 0 | 0 | Qi(k) |
| 0 | 1 | 0 | Qi(k) |
| 0 | 0 | 1 | Qi(k) |
| 0 | 1 | 1 | 0 |
| 0 | 0 | 0 | Qi(k) |

Enable signal ES depends on the predetermined number N' of TZ transitions and therefore on how often oscillator signal x(t) moves between Z1 and Z2. In other words, n' indicates the number of times that oscillator signal x(t) swings to or beyond either of thresholds Z1, Z2. The function of detector 40 is explained in connection with the signal-time diagrams of FIG. 3.

It is assumed that RESET at input 42 and therefore at Ri is RESET="1". Enable inputs E2 and E2 are at logical "0" and outputs Q1, Q2, and Q3 are at logical "0". Therefore, enable signal ES at output 45 is a logical "0".

(1) At t=t4, oscillator signal x(t) passes first threshold Z1. Second trigger signal TZ toggles from logical "0" to logical "1" (trace 173). Trigger signal TZ="1" is supplied to set inputs S1 and S3 via input 42 of detector 40. Set input S2 receives $\overline{TZ}$. Output Q1 of FF1 is set to logical "1". FF2 is thereby enabled (E2="1"). Outputs Q2 of FF2 and Q3 of FF3 do not change.

(2) At t=t5, oscillator signal x(t) goes below second threshold Z2, and second trigger 20 signal TZ toggles back to logical "0" (trace 174). This change is communicated to detector 40. Set input S1 and S3 receive logical "0" which is allowable, but does not invoke changes. Set input S2 of FF2 receives a logical "1" and output Q2 of FF2 goes to logical "1" enabling thereby E3 of FF3.

(3) At t=t6, oscillator signal x(t) again passes threshold Z1, and TZ goes to logical "1" again (trace 175). FF3 receives TZ at set input S3 and output Q3 provides logical "1" of enable signal ES.

In the simplified diagram as in FIG. 3, the pulse duties of TY and TZ are shown as being approximately constant beginning at t=t4. As it can be seen from FIG. 3, time point t4 precedes tx in which x(t) becomes a full swing signal. These assumptions are convenient but not essential for the invention. For example, thresholds |Z1| and |Z2| can have the same level as final amplitude A. In the example of FIG. 4, detector 40 has 3 flip-flops FFi, for counting n' to N'=3. In other words, oscillator signal x(t) goes consecutively over the full hysteresis range I2 in both directions, as here shown from Z1 to Z2 and from Z2 to Z1.

As an advantage of the invention, the predetermined number N' of TZ transitions can be small (e.g., N'=3) compared to prior art solutions. By adding flip-flops, the number N' of TZ transitions can be increased. This is also convenient, but not essential. Predetermined number N' is usefully N'<12, better less than N'=7 but larger than 2, and, preferably, N'=3. In general, odd-numbered flip-flops (i.e., FF1, FF3, FF5, . . . ) receive non-inverted TZ and even-numbered flip-flops (i.e., FF2, FF4 . . . ) receive inverted trigger signal TZ. A pair of FFi and FFi+1 is required to detect one period of x(t). Generally, detector 40 is a shift register in which a logical value (e.g., "1") is transferred in one direction (e.g., to the right) every time an input signal (e.g., TZ) toggles. In a modification of detector 40, inverter 46 can be left out, so that the logical value is transferred when an input signal (e.g., TZ) toggles in one, predetermined direction (e.g., to "1").

Construction of clock generator 100 and the method of the present invention have been explained in reference to FIGS. 2–4. In other words, the method is characterized by the following steps of: generating oscillator signal x(t); deriving first trigger signal TY from oscillator signal x(t), whereby TY toggles between logical states (e.g., "0" and "1") when said oscillator signal x(t) passes a first and a second threshold Y1, Y2 of first trigger 10; deriving second trigger signal TZ from oscillator signal x(t), whereby TZ toggles between logical states (e.g., "0" and "1") when oscillator signal x(t) passes a first and a second threshold Z1, Z2 of second trigger 20, the difference (Z1–Z2) between the thresholds of second trigger 20 being larger than the difference (Y1–Y2) between the thresholds of first trigger 10; and deriving an toggling clock signal (98) from said first trigger signal (18) when the number of togglings n' of said second trigger signal (28) reaches a predetermined number N'.

The use of apparatus and method of the invention is not limited to such instances when an application is switched on. As for example and not intended to be limiting, the present invention can conveniently be used for applications comprising several portions which are switched on and off separately. By such an approach, the power consumption of the application can be reduced.

In the foregoing detailed description of the preferred embodiment, reference was made to the accompanying drawings which form a part hereof, and in which were shown by way of illustration a specific embodiment in which the invention may be practiced. This embodiment has been described in sufficient detail to enable those skilled in the art to practice the invention, and it is to be understood that other embodiments may be utilized and that logical, mechanical and electrical changes may be made without departing from the spirit and scope of the present invention. The foregoing detailed description is, therefore, not to be taken in a limiting sense, and the scope of the present inventions is defined only by the appended claims.

We claim:

1. A clock generator for generating a clock signal comprising:

an oscillator providing an oscillator signal;

a first trigger receiving said oscillator signal, said first trigger having first and second thresholds Y1, Y2 with a first interval I1=|Y1−Y2|, said first trigger providing a first trigger signal;

a second trigger receiving said oscillator signal, said second trigger having first and second thresholds Z1, Z2 with a second interval I2=|Z1−Z2>|>I1, said second trigger providing a second trigger signal;

a detector for determining the number of times n' that said oscillator signal swings to or beyond either of said thresholds Z1, Z2 and generating an enable signal when n'>3; and a control circuit for receiving said enable signal and deriving said clock signal from said first trigger signal.

2. The clock generator of claim 1 wherein said first trigger has hysteresis so that said first trigger signal toggles when said oscillator signal passes said first threshold Y1 of said first trigger, and toggles back when said oscillator signal passes said second threshold Y2 of said first trigger in a second, opposite direction.

3. The clock generator of claim 1 wherein said second trigger has hysteresis so that said second trigger signal toggles when said oscillator signal passes said first threshold Z1 of said second trigger, and toggles back when said oscillator signal passes said second threshold Z2 of said second trigger in a second, opposite direction.

4. The clock generator of claim 1 wherein said control circuit conjunctively combines said first trigger signal and said enable signal to the clock signal.

5. The clock generator of claim 1 wherein said second interval I2 has a substantially doubled value of said first interval I1.

6. The clock generator of claim 1 wherein said first trigger and said second trigger are Schmitt triggers.

7. The clock generator of claim 1 wherein said detector comprises a first, a second, and a third flip-flop serially connected, said first and third flip-flop each having a set input receiving said second trigger signal, said second flip-flop receiving said second trigger signal in an inverted form, said second and third flip-flop each having an enable input coupled to an output of said first and second flip-flop, respectively, said third flip-flop having an output for providing said enable signal.

8. The clock generator of claim 1 wherein said detector is a shift register transferring a logical value when said second trigger signal toggles to either logical state.

9. The clock generator of claim 1 wherein said detector is a shift register transferring a logical value when said second trigger signal toggles to a predetermined logical state.

10. The clock generator of claim 1 wherein said control circuit is an AND-gate receiving said first trigger signal and said enable signal as input signals and providing the clock signal as output signal.

11. The clock generator of claim 1 wherein said detector receives a reset signal.

12. A method for generating a clock signal characterized by the following steps: generating an oscillator signal;

deriving a first trigger signal from said oscillator signal, said first trigger signal toggling between logical states when said oscillator signal passes a first and a second threshold of a first trigger;

deriving a second trigger signal from said oscillator signal, said second trigger signal toggling between logical states when said oscillator signal passes a first and a second threshold of a second trigger, the difference between said first and second thresholds of said second trigger being substantially larger than the difference between said first and second thresholds of said first trigger;

deriving said clock signal from said first trigger signal when the number of togglings of said second trigger signal reaches a predetermined number N'.

13. The method of claim 12 wherein said oscillator signal has a temporarily increasing amplitude so that said oscillator signal at first passes said first and second thresholds of said first trigger, at second passes said first and second thresholds of said second trigger and then remains substantially constant.

14. The method of claim 12 wherein said clock signal is derived from said second trigger signal by a conjunctive relation in a control circuit.

15. The method of claim 12 wherein the toggling of said second trigger signal is counted in a detector.

16. The method of claim 12 wherein said predetermined number N' is N'<12.

17. The method of claim 12 wherein said predetermined number N' is $3 \leq N' \leq 6$.

18. A generator for providing clock signals having a first trigger for deriving a first binary trigger signal from an analog oscillator signal, said generator characterized by:

a second trigger receiving the analog oscillator signal, said second trigger deriving a second binary trigger signal, said second trigger having a larger hysteresis range than the first trigger;

a detector receiving said second binary trigger signal for detecting when said analog oscillator signal has moved completely over the larger hysteresis range consecutively at least in a first and in a second direction and then providing an enable signal; and a control circuit receiving said enable signal from said detector and said first binary trigger signal, so that during starting up of said generator, said clock signal is derived from said first binary signal only after said detector enables said control circuit.

* * * * *

UNITED STATES PATENT AND TRADEMARK OFFICE
CERTIFICATE OF CORRECTION

PATENT NO. : 5,774,006  
DATED : June 30, 1998  
INVENTOR(S) : Udi Barel, Micha Stern, Ido Reuveny, Yoram Yeivin Page 1 of 1

It is certified that error appears in the above-identified patent and that said Letters Patent is hereby corrected as shown below:

<u>Column 7, claim 1,</u>  
Line 24, delete ">" and replace with -- $\geq$ --.

Signed and Sealed this

Twenty-sixth Day of March, 2002

Attest:

JAMES E. ROGAN  
Attesting Officer     Director of the United States Patent and Trademark Office